United States Patent
Bell et al.

[11] Patent Number: 6,111,192
[45] Date of Patent: Aug. 29, 2000

[54] HEIGHT REDUCIBLE EMI SHIELDED ELECTRONIC ENCLOSURE

[75] Inventors: Dean P. Bell, Atkins; Elizabeth D. Burke, Adwolfe; Paul E. Case, Glade Spring; Donald E. Johnston, Marion; Ronald L. McCord, Marion; Donald Stanulis, Marion; W. Jeffrey Sturgill, Marion, all of Va.

[73] Assignee: Marion Composites, Marion, Va.

[21] Appl. No.: 09/169,329

[22] Filed: Oct. 9, 1998

[51] Int. Cl.[7] ................................................ H05K 9/00
[52] U.S. Cl. .................................. 174/35 R; 174/356 C; 174/35 MS; 361/816; 361/818
[58] Field of Search ............................. 174/35 R, 35 GC, 174/35 MS, 57; 220/3.7; 361/816, 818; 49/505

[56] References Cited

U.S. PATENT DOCUMENTS

| | | | |
|---|---|---|---|
| 3,573,344 | 4/1971 | Snyder | 174/57 |
| 4,748,790 | 6/1988 | Frangolacci | 52/809 |
| 5,121,765 | 6/1992 | MacMorris, Jr. | 135/103 |
| 5,142,101 | 8/1992 | Matsuzaki et al. | 174/35 GC |
| 5,194,691 | 3/1993 | McIlwraith | 174/35 GC |
| 5,250,752 | 10/1993 | Cutright | 174/35 R |
| 5,747,734 | 5/1998 | Kozlowski et al. | 174/50 |
| 5,781,410 | 7/1998 | Keown et al. | 361/690 |
| 5,800,002 | 9/1998 | Tiedge et al. | 296/26 |
| 5,875,795 | 3/1999 | Bioux | 132/293 |

*Primary Examiner*—Kristine Kincaid
*Assistant Examiner*—W. David Walkenhorst
*Attorney, Agent, or Firm*—Wood, Phillips, VanSanten, Clark & Mortimer

[57] ABSTRACT

An EMI shielded collapsible enclosure includes an upper enclosure half having a top wall connecting a surrounding upper sidewall, the top wall and upper sidewall being adapted to provide EMI resistance. A lower enclosure half has a bottom wall connecting a surrounding sidewall, the bottom wall and lower sidewall being adapted to provide EMI resistance. The upper sidewall and lower sidewall are of similar shape, with one smaller than the other to be telescopically received therein. Actuators are operatively associated with the upper enclosure half and the lower enclosure half for selectively extending or retracting the enclosure halves between a transport mode and an operational mode, an interior space defined by the upper enclosure half and the lower enclosure half being substantially larger in the operational mode.

22 Claims, 9 Drawing Sheets

HEIGHT REDUCIBLE EMI SHIELDED ELECTRONIC ENCLOSURE

FIELD OF THE INVENTION

This invention relates to EMI shielded electronics enclosures and, more particularly, to an enclosure that can be reduced in height for transport or storage.

BACKGROUND OF THE INVENTION

The military utilizes electronics enclosures to house electronic gear used for command, control and communications. Other organizations also use such enclosures. Advantageously, electronics enclosures are designed to provide shielding from electromagnetic interference (EMI) that can interrupt proper operation of the sensitive electronic equipment. The shielding also prevents electromagnetic signals generated from equipment from being intercepted or used to pinpoint the location where such equipment is housed.

In military applications such electronics enclosures must be relocatable and rapidly deployable to support the intended mission. Typically the enclosures are mounted on prime movers such as light or medium tactical trucks. To achieve rapid deployment anywhere in the world, the enclosures and their prime movers are typically transported on military transport aircraft. It is desirable that the enclosure be transported while mounted on its prime mover so that mounting and dismounting the enclosure to its prime mover is not necessary in the field. For maximum transportability, it is necessary that these enclosures and their prime movers be transportable on aircraft as small as the C-130. The cargo size restrictions of the C-130 make it impossible for all but the smallest enclosure and prime mover combination to be transportable without dismounting the enclosure from the prime mover.

The present invention is directed to solving one or more of the problems discussed above in a novel and simple manner.

SUMMARY OF THE INVENTION

In accordance with the invention there is provided an EMI shielded electronics enclosure which collapses to a reduced height for transport and storage.

Broadly, there is disclosed herein an EMI shielded collapsible enclosure including an upper enclosure half having a top wall connecting a surrounding upper sidewall, the top wall and upper sidewall being adapted to provide EMI resistance. A lower enclosure half has a bottom wall connecting a surrounding sidewall, the bottom wall and lower sidewall being adapted to provide EMI resistance. The upper sidewall and lower sidewall are of similar shape, with one smaller than the other to be telescopically received therein. Actuator means are operatively associated with the upper enclosure half and the lower enclosure half for selectively extending or retracting the enclosure halves between a transport mode and an operational mode, an interior space defined by the upper enclosure half and the lower enclosure half being substantially larger in the operational mode.

It is a feature of the invention to provide a gasket disposed between the upper sidewall and the lower sidewall to provide a seal therebetween. The gasket provides EMI shielding.

It is another feature of the invention that the tipper sidewall is of a larger size than the lower sidewall, so that in the transport mode the lower sidewall is received in the upper sidewall.

It is a further feature of the invention that the upper sidewall includes an opening aligned with a corresponding lower sidewall opening to provide an entryway. A door frame is removably mounted to the smaller sidewall about its respective opening to provide a door mounting surface flush with the larger sidewall.

It is a further feature of the invention that the actuator means comprises a linear hydraulic actuator. A plurality of hydraulic cylinders are included.

It is still another feature of the invention to provide means for locking the upper enclosure half to the lower enclosure half in the transport node.

It is still another feature of the invention to provide racks movably mounted to an interior of at least one of the upper enclosure half and the lower enclosure half.

There is disclosed in accordance with another aspect of the invention an EMI shielded collapsible enclosure including an upper enclosure half having a generally rectangular top wall connecting a surrounding upper sidewall in a generally parallelepiped configuration, the top wall and upper sidewall being adapted to provide EMI resistance. A lower enclosure half has a generally rectangular bottom wall connecting a surrounding lower sidewall in a generally parallelepiped configuration, the bottom wall and lower sidewall being adapted to provide EMI resistance. The upper sidewall is larger than the lower sidewall to telescopically receive the lower sidewall therein. Actuator means are operatively associated with the upper enclosure half and the lower enclosure half for selectively extending or retracting the enclosure halves between a transport mode and an operational mode, an interior space defined by the upper enclosure half and the lower enclosure half being substantially larger in the operational mode.

It is a feature of the invention to provide a gasket disposed between the upper sidewall and the lower sidewall to provide a seal therebetween. The gasket provides EMI shielding and weather shielding. EMI shielding is provided by the gasket being in the configuration of a round bulb in cross-section.

It is a further feature of the invention that the upper sidewall includes an opening aligned with a corresponding lower sidewall opening to provide an entryway. A door frame is removably mounted to the lower sidewall about the lower sidewall opening to provide a door mounting surface flush with the upper sidewall. The door frame is removably mounted to the lower sidewall with plural quick release latches.

It is another feature of the invention to provide means for locking the upper enclosure half to the lower enclosure half in the transport mode. The locking means comprises a tubular rod extending through a tubular bracket mounted at a lower corner of the upper sidewall, below the bottom wall in the transport mode.

It is another feature of the invention to provide a rack movably mounted to an interior of at least one of the upper enclosure half and the lower enclosure half. The rack comprises an upper rack half mounted to the upper enclosure and a lower rack half mounted to the lower enclosure half. One of the rack halves is fixedly mounted in its associated enclosure half and the other rack half is movably mounted in its associated enclosure half. The other rack half is slide mounted to its associated enclosure half to provide space for the one rack half in the transport mode.

Further features and advantages of the invention will be readily apparent from the specification and from the drawing.

DETAILED DESCRIPTION OF THE INVENTION

In accordance with the invention there is provided an electromagnetic interference (EMI) shielded electronics enclosure that may be transported on an aircraft as small as a C-130 without dismounting the enclosure from its prime mover while still providing shielding from EMI in its deployed configuration. The design provides the ability to transport the enclosure while mounted to its prime mover, resulting in significant reduction in cargo space requirements, resulting in lower transportation costs and a reduction in wind drag during normal transport on the prime mover or during external airlift.

Figure 1:
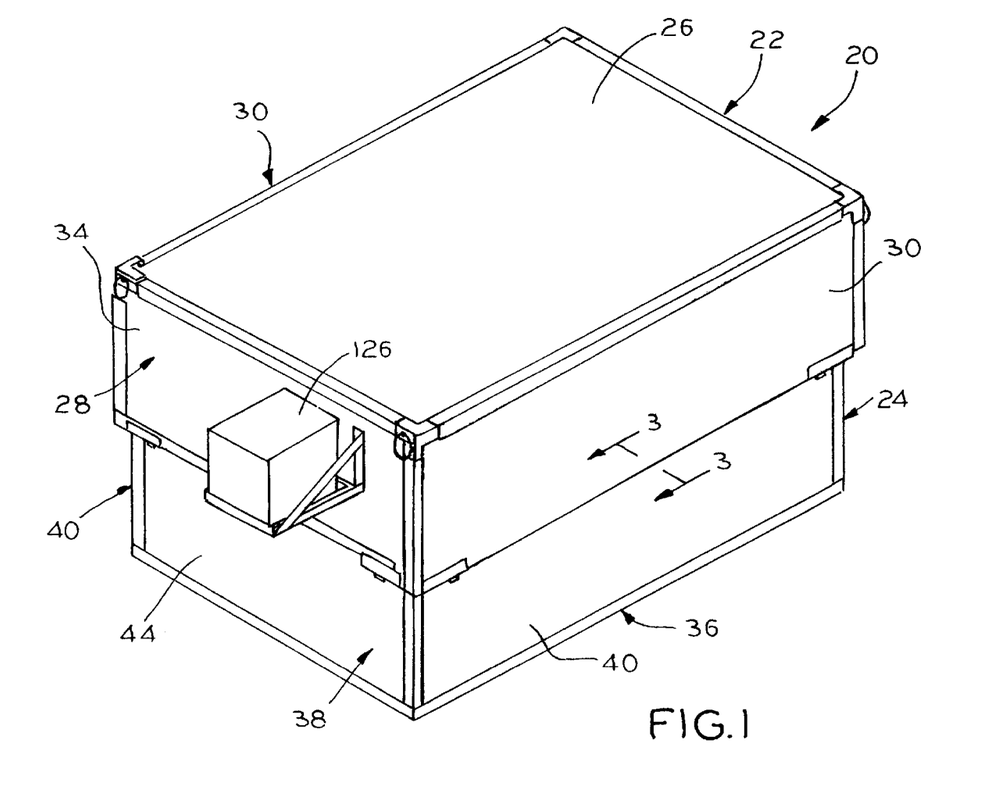
FIG. 1 is a perspective view of an EMI shielded collapsible enclosure according to the invention in an operational mode.
Figure 17:
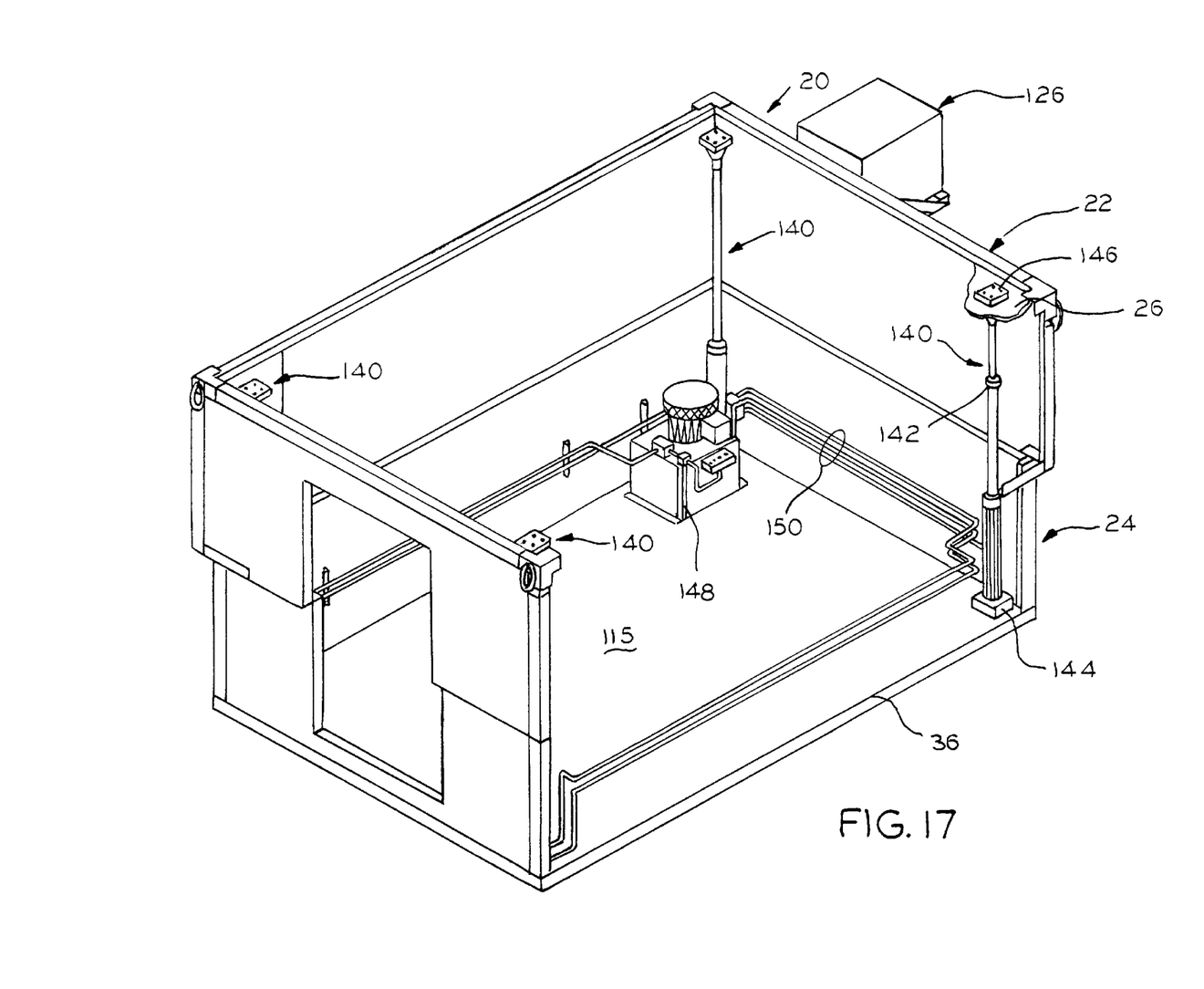
FIG. 17 is a perspective view, with parts removed for clarity, illustrating an actuator system according to the invention for extending and retracting the enclosure between the transport mode and operational mode.

An EMI shielded collapsible enclosure 20 according to the invention is illustrated in an operational mode in FIG. 1. The enclosure 20 is illustrated in a shipping or transport mode in FIG. 2. As is readily apparent, the enclosure 20 in the transport mode is approximately one-half the height as in the operational mode to provide the benefits noted above. Actuators, shown in FIG. 17, are operatively associated with the enclosure 20 for selectively extending or retracting the enclosure 20 between the transport mode and the operational mode, an interior space defined by the enclosure 20 being substantially larger in the operational mode.

The enclosure 20 includes an upper enclosure half 22 and a lower enclosure half 24. The upper enclosure half 22 includes a top wall 26 connecting a surrounding upper sidewall 28. In the illustrated embodiment, the top wall 26 is generally rectangular panel and the sidewall 28 consists of opposite side panels 30, a rear end panel 32, see FIG. 4, and a front end panel 34. The top wall 26 and sidewall 28 provide a generally parallelepiped configuration. Similarly, the lower enclosure half 24 has a generally rectangular bottom wall 36 connecting a surrounding lower sidewall 38. The lower sidewall 38 includes opposite side panels 40, a rear end panel 42, see FIG. 4, and a front end panel 44. The bottom wall 36 and lower sidewall 38 provide a generally parallelepiped configuration. As is particularly illustrated in FIG. 1, the upper sidewall 28 is slightly larger than the lower sidewall 38 to telescopically receive the lower sidewall 38 therein.

The top wall 26, bottom wall 36, and upper sidewall 28 and lower sidewall 38 are adapted to provide EMI resistance. Particularly, each of the panels uses conventional design for EMI enclosures. Each panel includes a tubular, peripheral frame covered by an appropriate inner and outer skin such as of aluminum with a foam or honeycomb core or the like. One example of such a panel design is illustrated in Sturgill et al., U.S. Pat. No. 5,713,178, assigned to the assignee of the present invention, the specification of which is hereby incorporated by reference herein. However, the present invention is not directed to use of any particular panel design. The panels are connected at adjacent corners using conventional interface connections.

Figure 3:
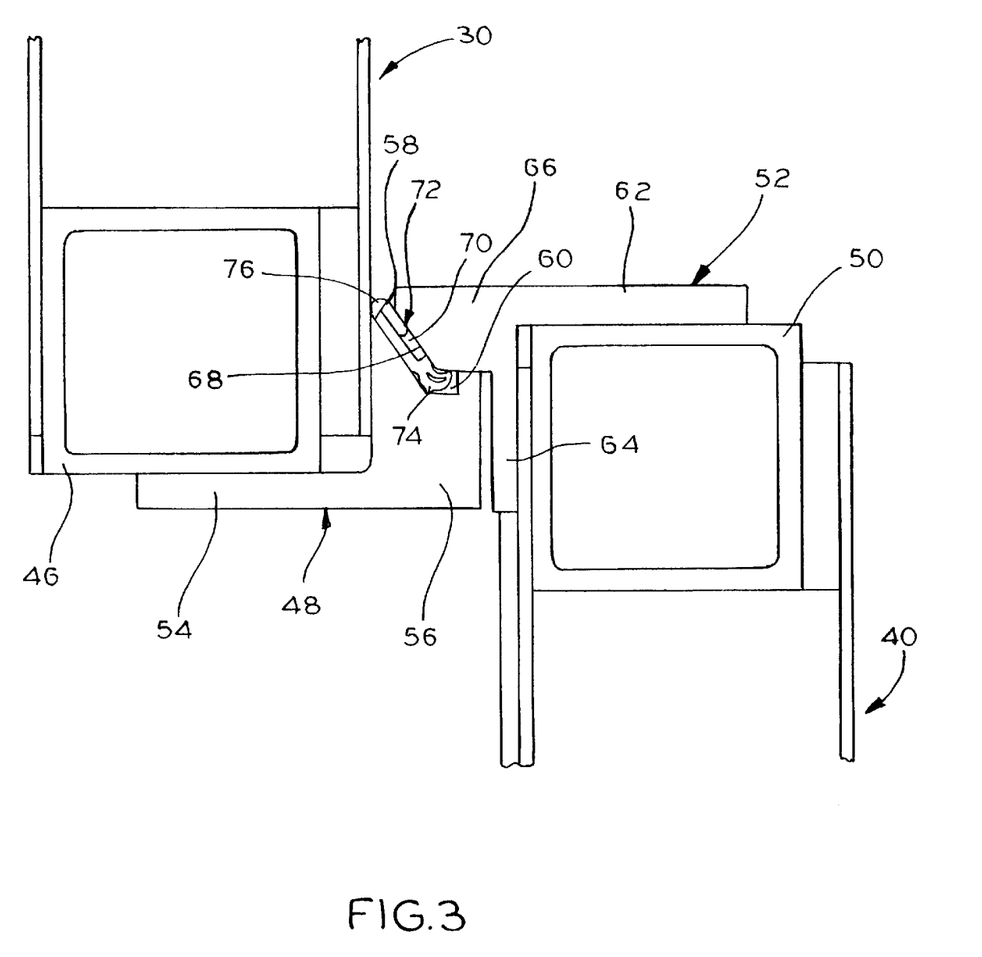
FIG. 3 is a sectional view taken along the line 3—3 of FIG. 1.

EMI shielding between the upper enclosure half 22 and lower enclosure half 24 is maintained via a joint design illustrated in FIG. 3. Although not shown, the described joint design is used around all mating edges of the upper sidewall 28 and the lower sidewall 38. Particularly, the upper enclosure side panel 30 includes a lower edge tubular frame 46 connected to an elongate upper extrusion 48. Similarly, the lower sidewall side panel 40 includes an upper edge tubular frame 50 connected to an elongate lower extrusion 52. The extrusions are of one piece construction and are adapted to provide a diagonal "mating" area. The upper extrusion 48 is generally L-shaped, having a bottom plate 54 extending from a block 56. The block 56 has an upper diagonal surface 58 terminating at a notch 60. The lower extrusion 52 is also generally L-shaped, including an upper plate 62 and side plate 64 surrounding the lower panel 40 and connected to a block 66 having a diagonal surface 68 generally parallel to the diagonal upper surface 58 of the upper extrusion 48 to provide a space 70 therebetween. A gasket 72 is disposed in the space 70 to provide both a weather seal as well as EMI shielding. The gasket 72 is of conventional construction and includes a round bulb portion 74 to provide a weather shield and a V-shaped portion 76 to provide EMI shielding. The gasket 72 may be made, for example, of copper, wire mesh, or rubber impregnated with metallic whiskers. The gasket 72 is of elongate one-piece construction.

Figure 4:
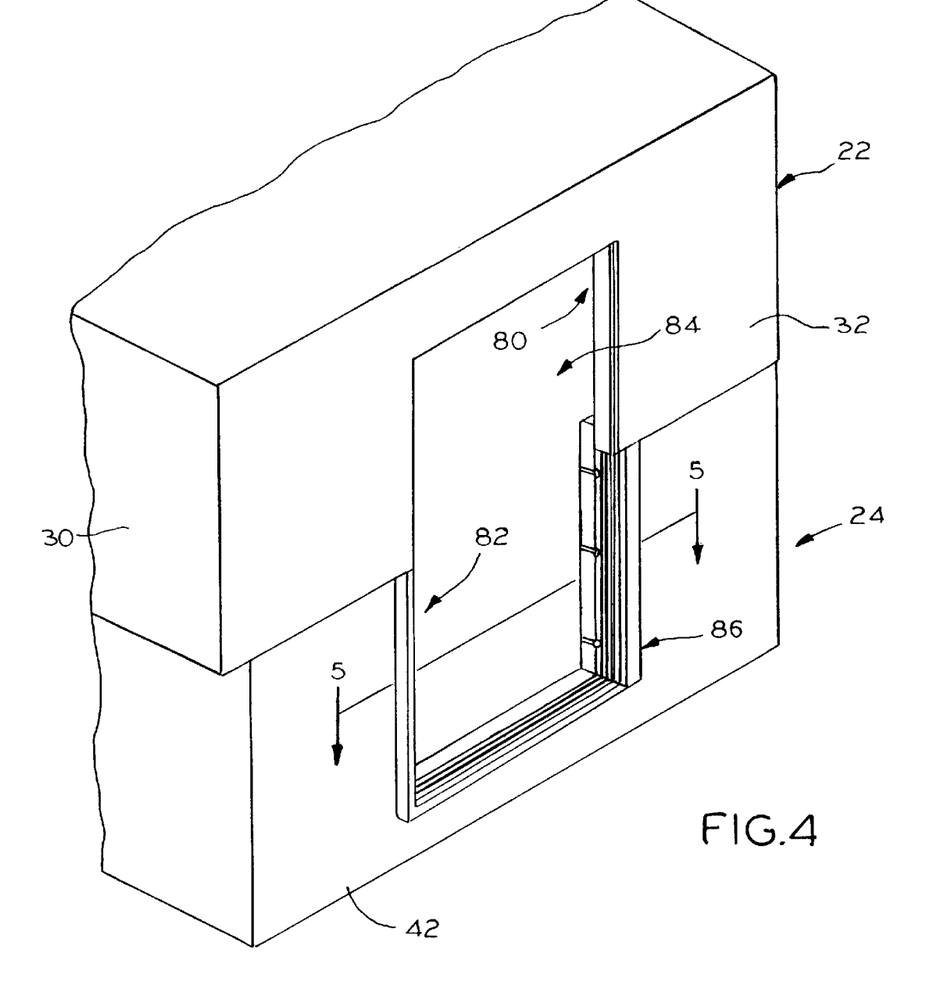
FIG. 4 is a partial perspective view illustrating an entryway for the enclosure of FIG. 1.
Figure 5:
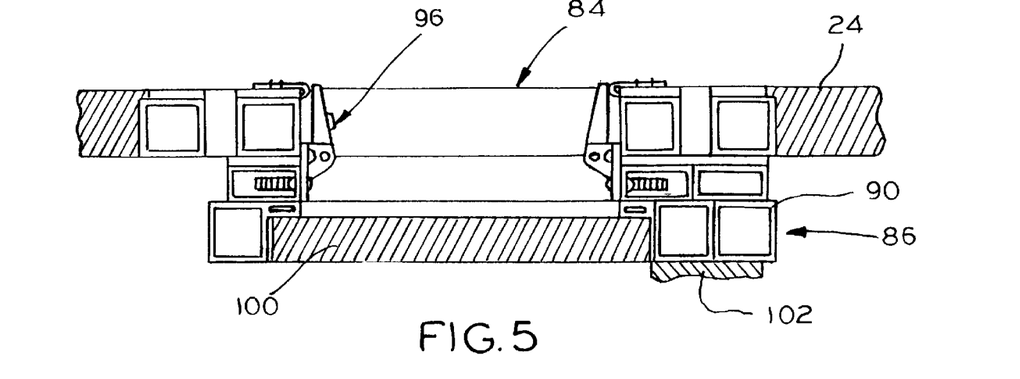
FIG. 5 is a sectional view taken along the line 5—5 of FIG. 4 illustrating a door mounted in the entryway.
Figure 6:
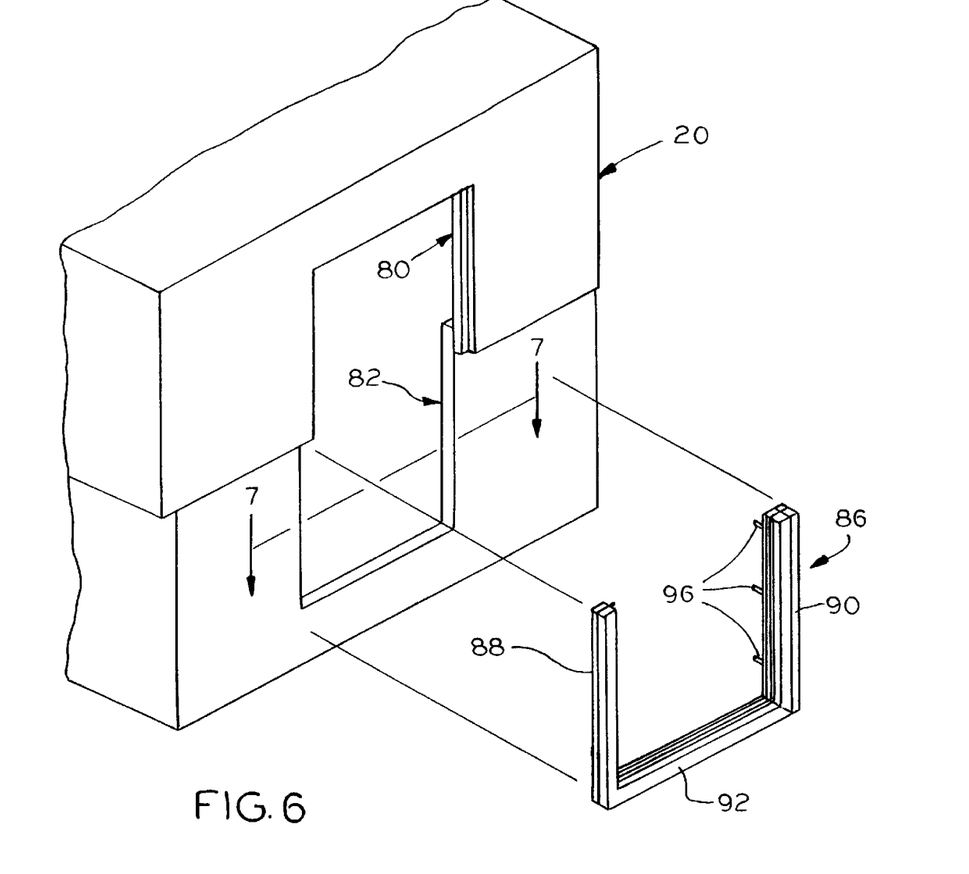
FIG. 6 is a perspective view similar to that of FIG. 4 illustrating the door frame removed.
Figure 7:
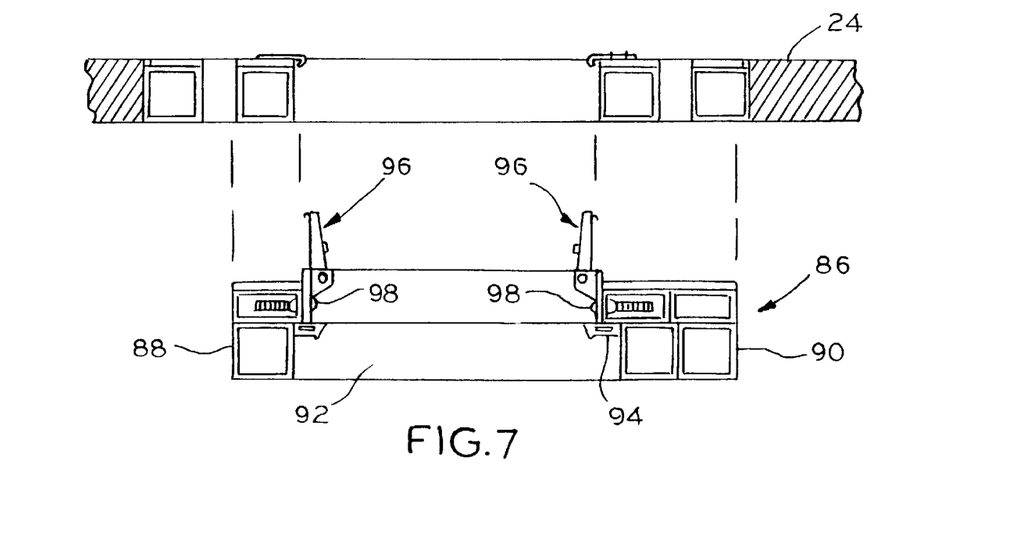
FIG. 7 is a sectional view taken along the line 7—7 of FIG. 6.

With reference to FIGS. 4–7, the upper rear end panel 32 includes a rectangular upper opening 80 aligned with a corresponding lower opening 82 in the lower rear end panel 42 to provide an entryway 84. As is apparent, special provisions are required to maintain EMI shielding in the area of the entryway 84. The size difference of the upper enclosure half 22 and lower enclosure half 24 results in doorjambs which are not in the same plane. To provide EMI shielding at the entryway 84, a quick release removable door frame 86 or door jamb is used. Particularly, FIGS. 4 and 5 illustrate the door frame 86 installed, while FIGS. 6 and 7 illustrate the door frame 86 removed. As is apparent, the door frame 86 is removed when necessary to retract the halves 22 and 24 for the transport mode.

Referring particularly to FIGS. 6 and 7, the door frame 86 is of generally tubular construction. The door frame 86 is U-shaped and includes a left side piece 88 and a right side piece 90 connected at joints to a lower piece 92. The door frame 86 is made of aluminum extrusions. The right side piece 90 is double width, as illustrated, for mounting door hinges, as described below. The frame includes an integral EMI seal interface 94. Each of the left and right side pieces 88 and 90 includes three quick release latches 96 secured using fasteners 98. The latches 96 in the illustrated embodiment of the invention comprise Camloc medium duty tension latches, 51L series. When the enclosure 20 is extended to the operational mode, as illustrated in FIGS. 4 and 6, the door frame 86 is aligned in the lower opening 82. Although not shown, suitable alignment pins and openings may be included. The latches 96 are then operated in the conventional manner to secure the door frame 86 surrounding the lower opening 82. As installed, the door frame 86 provides a generally flush configuration with the upper opening 80, which is configured for receiving a door 100. The door 100 is mounted in the entryway 84 using plural hinges 102, one of which is illustrated in FIG. 5. For example, two hinges 102 may be provided secured to the right side piece 90. Likewise, two hinges 102 are fastened directly to the upper front end panel 32. The upper opening 80 is configured to match the configuration of the door frame 86.

Thus, the door jamb surface of the lower enclosure half 24 is brought out to the plane of the larger upper enclosure half 22 via the quick release removable door frame 86. The door frame 86 may be removed and stored inside the unit along with a removable personnel door 100 when not in use. For deployment, the door frame 86 is installed and the door 100 is pinned in place, as described. The door frame 86 and likewise the upper opening 80 are configured to provide an EMI tight joint accomplished by metal to metal contact maintained by quick release clamping pressure.

Although not shown, the enclosure may use a split "Dutch" door with a fixed half and a relocatable half. One half must be relocatable in order to prevent interference between the larger half of the enclosure and the other door half and/or its hinges during retraction. The relocatable half and its door frame may swing out of the way, translate out of the way, or be completely removed, as discussed above.

Figure 8:
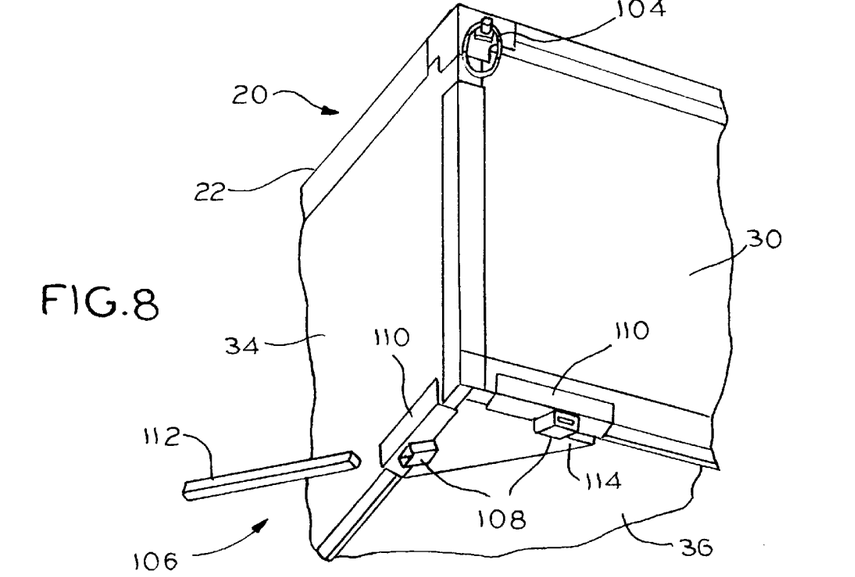
FIG. 8 is a partial bottom perspective view illustrating structure for locking the enclosure in the transport mode.
Figures 9, 10:
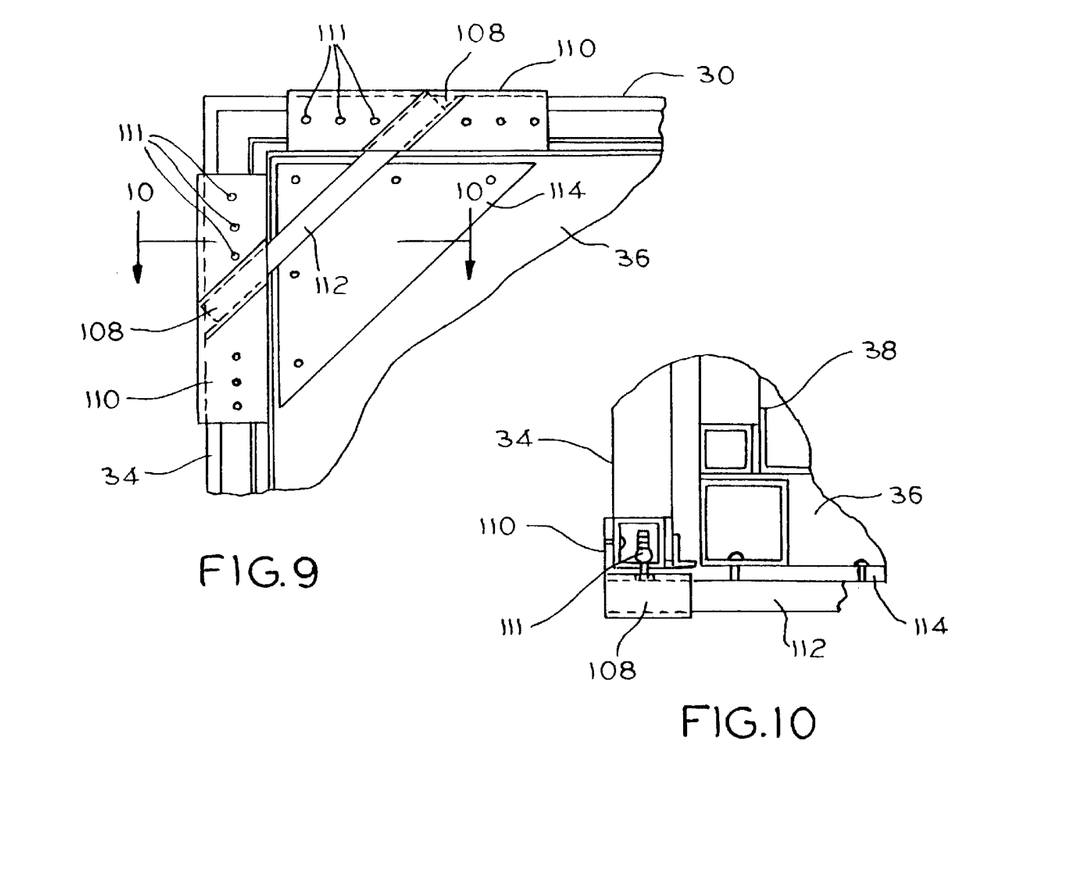
FIG. 9 is a partial bottom plan view illustrating the locking mechanism.
FIG. 10 is a sectional view taken along the line 10—10 of FIG. 9.
Figure 11:
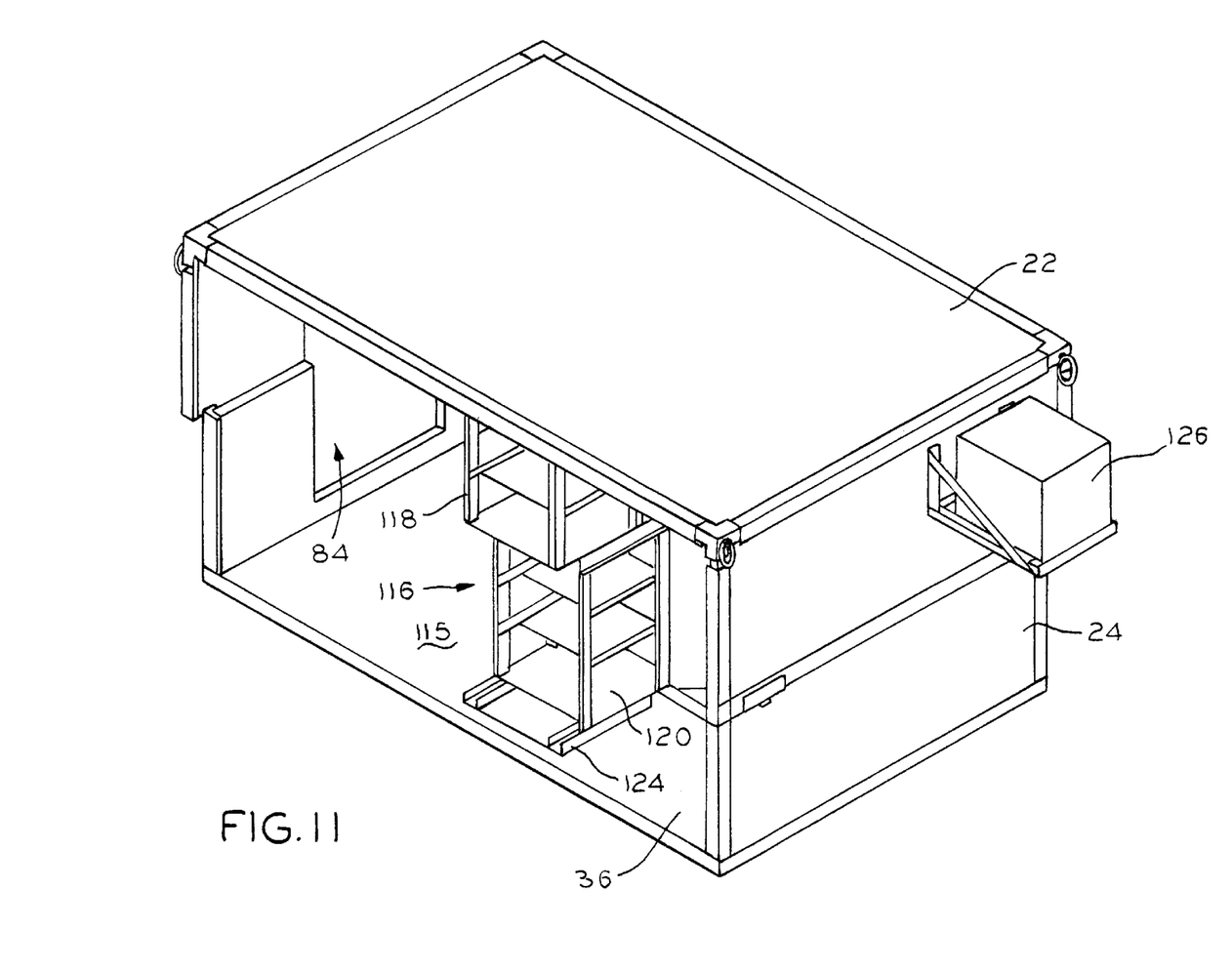
FIG. 11 is a perspective view with a wall removed for clarity illustrating a rack movably mounted in the enclosure of FIG. 1 to provide clearance to retract the enclosure.

Referring to FIGS. 8–10, it is sometimes necessary to transport the enclosure 20 via external air transport. This can be accomplished by connecting lift slings to lift rings 104 mounted at each upper corner of the upper enclosure half 22. To lift the enclosure in its retracted configuration, locking structure 106 is provided at each lower corner to structurally lock the two halves 22 and 24 in the retracted configuration. Particularly, the locking structure 106 at each corner consists of a pair of tubular sleeves or brackets 108 mounted in a diagonal, linearly aligned configuration. The sleeves 108 are connected as by welding to L-brackets 110 for mounting to the panels 34 and 30 using fasteners 111. The sleeves 108 are generally rectangular in configuration. An elongate smaller square tube 112 is of a length corresponding to the distance between outermost points of the sleeves 108 to be received therein, as illustrated in FIGS. 9 and 10. Particularly, the tube 112 is thereby disposed beneath the lower enclosure half rectangular bottom wall 36. Consequently, when the upper enclosure half 22 is raised, the tubes 112 abut the bottom wall 36 at each corner so that the lower enclosure half 24 is effectively locked to the upper enclosure half 22. A triangular plate 114 is secured at each corner of the bottom wall 36 for strengthening the corner.

The electronic equipment that is housed in an electronics enclosure is typically mounted in racks along the walls of the enclosure. The racks are typically the full height of the enclosure in order to maximize the amount of equipment that can be housed. In order to utilize full height racks in the collapsible enclosure 20, spilt movable racks 116, see FIGS. 11–14, are utilized in an interior space 115. While only one rack 116 is illustrated, plural such racks may be utilized, as will be apparent.

Figure 12:
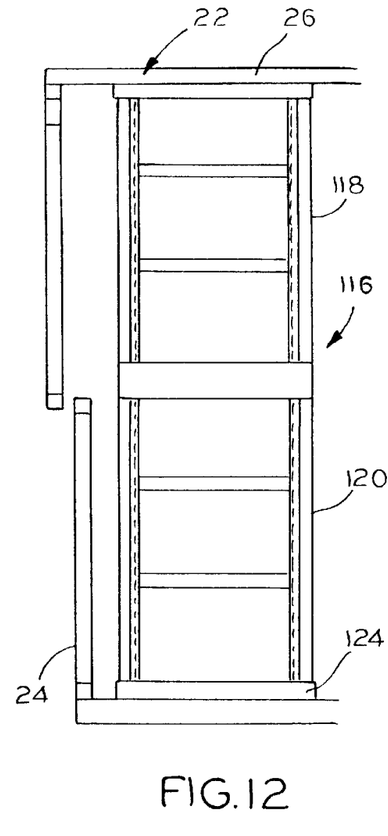
FIGS. 12, 13 and 14 illustrate a sequence of operation for moving the rack of FIG. 11.
Figure 13:
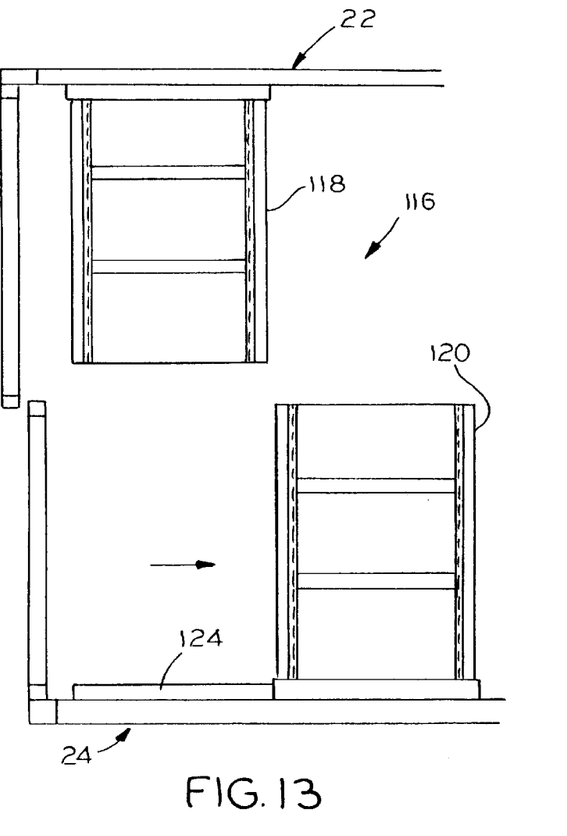
Figure 14:
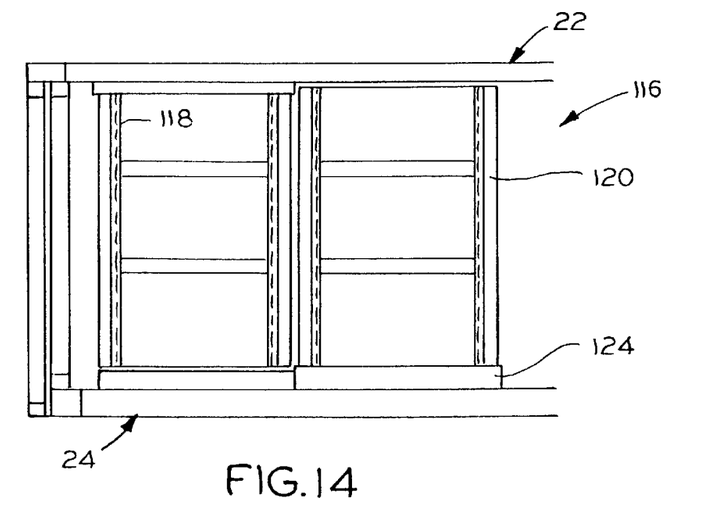

The rack 116 includes an upper rack half 118 mounted to the upper enclosure half 22 and a lower rack half 120 mounted to the lower enclosure half 24. Particularly, the upper rack half 118 is fixedly mounted to the top wall 26. The lower rack half 120 is movably mounted on a slide mount 124 to the bottom wall 36. The rack 116 in its normal operating state is illustrated in FIG. 12. When it is desired to retract the enclosure 20, the bottom rack half 112 is slidably moved as illustrated in FIG. 13, so that it is slid out of the way Such as into a center aisle. The enclosure 20 can then be retracted to the transport position, illustrated in FIG. 14, so that the rack halves 118 and 120 are then side-by-side.

Figure 2:
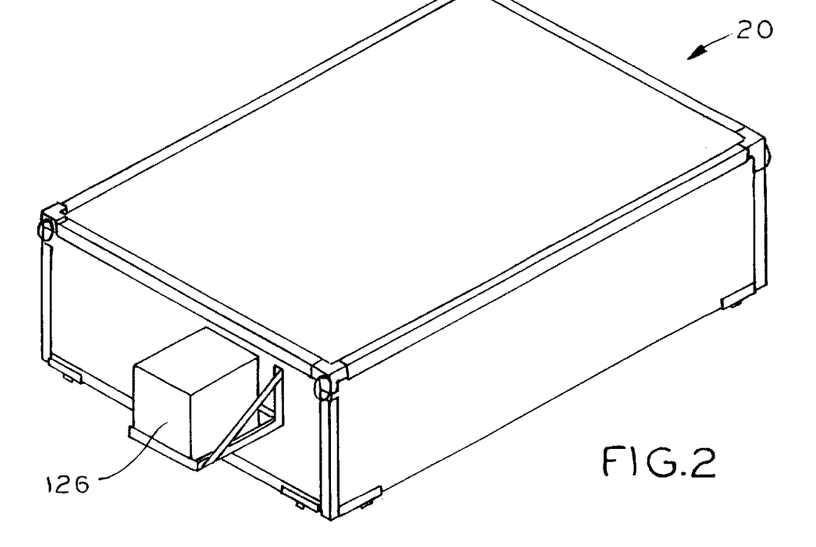
FIG. 2 is a perspective view of the enclosure of FIG. 1 in a transport mode.
Figure 15:
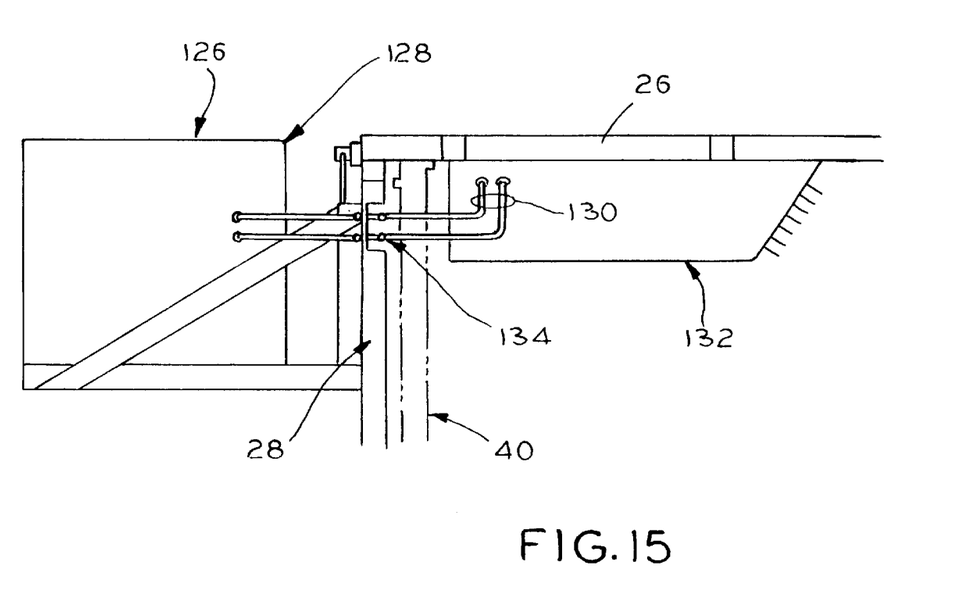
FIG. 15 is a partial elevation view illustrating quick disconnect bulkhead fittings for refrigerant lines.
Figure 16:
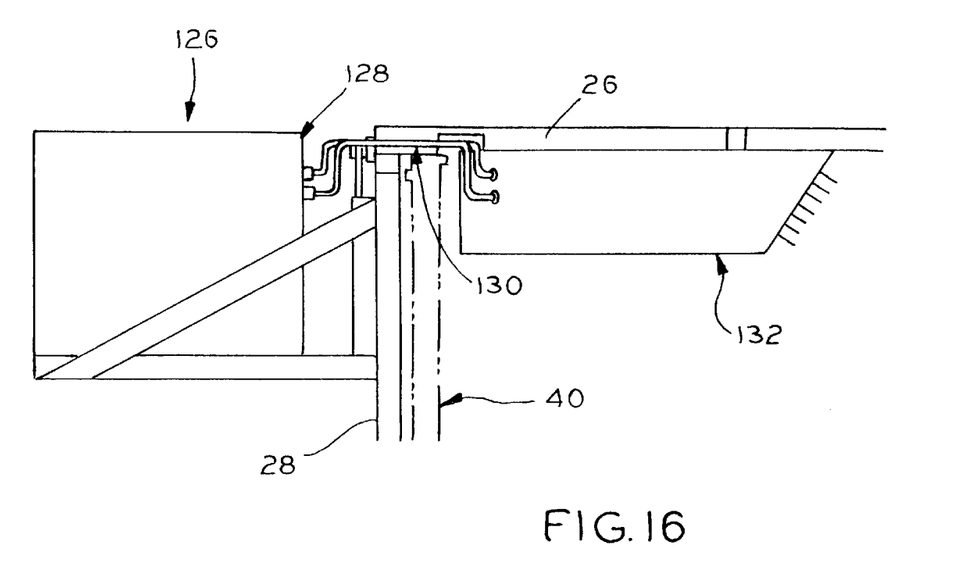
FIG. 16 is a view similar to that of FIG. 15 illustrating routing of refrigerant lines through the roof line.

Environmental control is provide by an externally mounted environmental control unit (ECU) 126, see FIGS. 1 and 2. Particularly, the ECU 126 includes a compressor and condenser unit 128, see FIG. 15, connected via refrigerant line 130 to an evaporator 132. The evaporator is mounted in the interior of the enclosure 20, while the compressor and condenser are externally mounted. The evaporator 132 is mounted spaced from the upper sidewall 28 to provide clearance for the lower sidewall side panel 40. Quick disconnect refrigerant connectors 134 are used to disconnect the refrigerant lines 130 during retraction. Alternatively, as illustrated in FIG. 16, the refrigerant lines 130 are routed through the top wall panel 26. This avoids interference with the enclosure retraction and eliminates the need to disconnect the line.

Extension and retraction of the upper enclosure half 22 and lower enclosure half 24 is provided via a linear actuator 140 at each corner. In accordance with the invention, the actuators 140 may be electroinechanically, hydraulically, or pneumatically operated. In the illustrated embodiment of the invention, each actuator 140 includes a telescoping hydraulic cylinder 142 disposed between a bottom plate 144 and a top plate 146. The bottom plate 144 is secured to the bottom wall 36 at each corner. The top plate 146 is secured to the top wall panel 26 at each corner. An hydraulic system 148 is mounted in the interior space 115 of the enclosure 20 and is connected via suitable hydraulic plumbing 150 to each cylinder 142 for operating the same. As is apparent, the hydraulic system 148 could be externally mounted and connected via suitable couplings and/or hoses.

To extend the housing 20 the cylinders 142 are extended until the housing 20 is as shown in FIG. 1. For retraction the cylinders are retracted until the housing 20 is as shown in FIG. 2. The hydraulic system 148 may use any conventional control for extension and retraction.

While the housing 20 is illustrated to have a parallelepiped configuration, the housing may take other shapes in accordance with the invention. Although not specifically shown, the enclosure 20 is of a size to be mounted, for example, to a prime mover such as the family of medium tactical vehicles, or larger. The enclosure 20 is of a size to be occupied by personnel suitable for the particular application. In the illustrated embodiment of the invention, the enclosure 20 is approximately eight feet wide, seven-and-one-half feet high and twelve feet long.

Thus, in accordance with the invention, there is provided all electronics enclosure that can be collapsed to a reduced height for transport.

We claim:

1. An electromagnetic interference (EMI) shielded collapsible enclosure comprising:
    an upper enclosure half having a top wall connecting a surrounding upper sidewall, the top wall and upper sidewall being adapted to provide EMI resistance;
    a lower enclosure half having a bottom wall connecting a surrounding sidewall, the bottom wall and lower sidewall being adapted to provide EMI resistance, the upper sidewall and lower sidewall being of similar shape, with one smaller than the other to be telescopically received therein; and
    actuator means operatively associated with the upper enclosure half and the lower enclosure half for selectively extending or retracting the enclosure halves between a transport mode and an operational mode, an interior space defined by the upper enclosure half and the lower enclosure half being substantially larger in the operational mode,
    wherein the upper sidewall includes an opening aligned with a corresponding lower sidewall opening to provide an entryway.

2. The EMI shielded collapsible enclosure of claim 1 further comprising a gasket disposed between the upper sidewall and the lower sidewall to provide a seal therebetween.

3. The EMI shielded collapsible enclosure of claim 2 wherein the gasket provides EMI shielding.

4. The EMI shielded collapsible enclosure of claim 1 wherein the upper sidewall is of a larger size than the lower sidewall, so that in the transport mode the lower sidewall is received in the upper sidewall.

5. The EMI shielded collapsible enclosure of claim 1 further comprising a door frame removably mounted to the smaller sidewall about its respective opening to provide a door mounting surface flush with the larger sidewall.

6. The EMI shielded collapsible enclosure of claim 1 wherein the actuator means comprises a linear hydraulic actuator.

7. The EMI shielded collapsible enclosure of claim 6 wherein the linear hydraulic actuator includes a plurality of hydraulic cylinders.

8. The EMI shielded collapsible enclosure of claim 1 further comprising means for locking the upper enclosure half to the lower enclosure half in the transport mode.

9. The EMI shielded collapsible enclosure of claim 1 further comprising racks movaby mounted to an interior of at least one of the upper enclosure half and the lower enclosure half.

10. An electromagnetic interference (EMI) shielded collapsible enclosure comprising:
    an upper enclosure half having a generally rectangular top wall connecting a surrounding upper sidewall in a generally parellelepiped configuration, the top wall and upper sidewall being adapted to provide EMI resistance;
    a lower enclosure half having a generally rectangular bottom wall connecting a surrounding lower sidewall in a generally parallelepiped configuration, the bottom wall and lower sidewall being adapted to provide EMI resistance, the upper sidewall being larger than the lower sidewall to telescopically receive the lower sidewall therein; and
    actuator means operatively associated with the upper enclosure half and the lower enclosure half for selectively extending or retracting the enclosure halves between a transport mode and an operational mode, an interior space defined by the upper enclosure half and the lower enclosure half being substantially larger in the operational mode,
    wherein the upper sidewall includes an opening aligned with a corresponding lower sidewall opening to provide an entryway.

11. The EMI shielded collapsible enclosure of claim 10 further comprising a gasket disposed between the upper sidewall and the lower sidewall to provide a seal therebetween.

12. The EMI shielded collapsible enclosure of claim 10 wherein the gasket provides EMI shielding.

13. The EMI shielded collapsible enclosure of claim 12 wherein the gasket is in the configuration of a round bulb in cross section.

14. The EMI shielded collapsible enclosure of claim 11 further comprising a door frame removably mounted to the lower sidewall about the lower sidewall opening to provide a door mounting surface flush with the upper sidewall.

15. The EMI shielded collapsible enclosure of claim 14 wherein the door frame is removably mounted to the lower sidewall with plural quick release latches.

16. The EMI shielded collapsible enclosure of claim 10 wherein the actuator means comprises a linear hydraulic actuator.

17. The EMI shielded collapsible enclosure of claim 16 wherein the linear hydraulic actuator includes a plurality of hydraulic cylinders.

18. The EMI shielded collapsible enclosure of claim 10 further comprising means for locking the upper enclosure half to the lower enclosure half in the transport mode.

19. The EMI shielded collapsible enclosure of claim 10 further comprising a rack movably mounted to an interior of at least one of the upper enclosure half and the lower enclosure half.

20. An electromagnetic interference (EMI) shielded collapsible enclosure comprising:
    an upper enclosure half having a generally rectangular top wall connecting a surrounding upper sidewall in a generally parellelepiped configuration, the top wall and upper sidewall being adapted to provide EMI resistance;
    a lower enclosure half having a generally rectangular bottom wall connecting a surrounding lower sidewall in a generally parallelepiped configuration, the bottom wall and lower sidewall being adapted to provide EMI resistance, the upper sidewall being larger than the lower sidewall to telescopically receive the lower sidewall therein;
    actuator means operatively associated with the upper enclosure half and the lower enclosure half for selectively extending or retracting the enclosure halves between a transport mode and an operational mode, an interior space defined by the upper enclosure half and the lower enclosure half being substantially larger in the operational mode; and
    means for locking the upper enclosure half to the lower enclosure half in the transport mode, wherein the locking means comprises a tubular rod extending through a tubular bracket mounted at a lower corner of the upper sidewall, below the bottom wall in the transport mode.

21. An electromagnetic interference (EMI) shielded collapsible enclosure comprising:
    an upper enclosure half having a generally rectangular top wall connecting a surrounding upper sidewall in a generally parellelepiped configuration, the top wall and upper sidewall being adapted to provide EMI resistance;

a lower enclosure half having a generally rectangular bottom wall connecting a surrounding lower sidewall in a generally parallelepiped configuration, the bottom wall and lower sidewall being adapted to provide EMI resistance, the upper sidewall being larger than the lower sidewall to telescopically receive the lower sidewall therein;

actuator means operatively associated with the upper enclosure half and the lower enclosure half for selectively extending or retracting the enclosure halves between a transport mode and an operational mode, an interior space defined by the upper enclosure half and the lower enclosure half being substantially larger in the operational mode; and a rack slidably mounted to an interior of at least one of the upper enclosure half and the lower enclosure half, wherein the rack comprises an upper rack half mounted to the upper enclosure half and a lower rack half mounted to the lower enclosure half, one of the rack halves being fixedly mounted in its associated enclosure half and the other rack half being movably mounted in its associated enclosure half.

22. The EMI shielded collapsible enclosure of claim 21 wherein the other rack half is slide mounted to its associated enclosure half to provide space for the one rack half in the transport mode.

* * * * *